(12) United States Patent
Kojima

(10) Patent No.: US 7,630,207 B2
(45) Date of Patent: Dec. 8, 2009

(54) WIRING BOARD, METHOD OF MANUFACTURING WIRING BOARD, AND LIQUID EJECTION HEAD

(75) Inventor: Toshiya Kojima, Ashigara-Kami-Gun (JP)

(73) Assignee: Fujifilm Corporation, Tokyo (JP)

( * ) Notice: Subject to any disclaimer, the term of this patent is extended or adjusted under 35 U.S.C. 154(b) by 371 days.

(21) Appl. No.: 11/520,667

(22) Filed: Sep. 14, 2006

(65) Prior Publication Data
US 2007/0097154 A1     May 3, 2007

(30) Foreign Application Priority Data
Sep. 15, 2005     (JP) .............................. 2005-268560

(51) Int. Cl.
*H05K 7/00*     (2006.01)
(52) U.S. Cl. ........................................ 361/760; 174/255
(58) Field of Classification Search ................. 361/760; 174/261, 255; 427/98, 271
See application file for complete search history.

(56) References Cited
U.S. PATENT DOCUMENTS
6,521,285 B1     2/2003     Biebuyck et al.
6,640,434 B1 *  11/2003    Wojewnik et al. .............. 29/846
6,737,170 B2 *   5/2004    Fitch et al. .................... 428/480
2004/0124533 A1 * 7/2004   Keser et al. .................. 257/758
2008/0239021 A1 * 10/2008  Watanabe ..................... 347/70
2008/0272388 A1 * 11/2008  Ushiyama et al. ............. 257/98

FOREIGN PATENT DOCUMENTS
JP     6-196840 A     7/1994
JP     6-302936 A     10/1994
JP     2003-502507 A  1/2003

* cited by examiner

*Primary Examiner*—Dean A. Reichard
*Assistant Examiner*—Yuriy Semenenko
(74) *Attorney, Agent, or Firm*—Birch, Stewart, Kolasch & Birch, LLP

(57) ABSTRACT

The wiring board has electrical wires of a prescribed pattern. More specifically, the wiring board has a substrate on which grooves are formed in the prescribed pattern, each of the grooves having an undercut part; and a conductive material which is disposed inside the grooves so as to serve as the electrical wires.

14 Claims, 15 Drawing Sheets

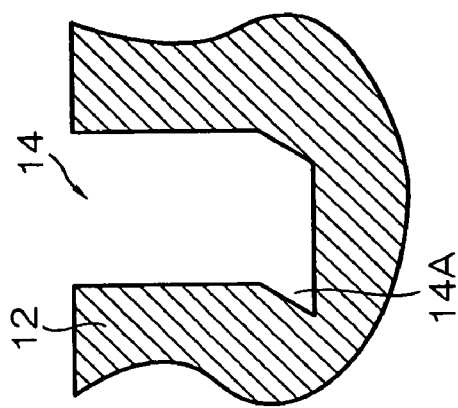
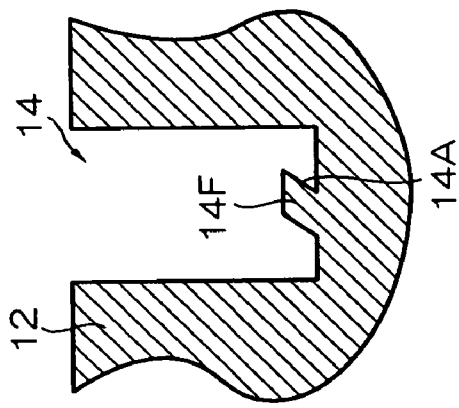
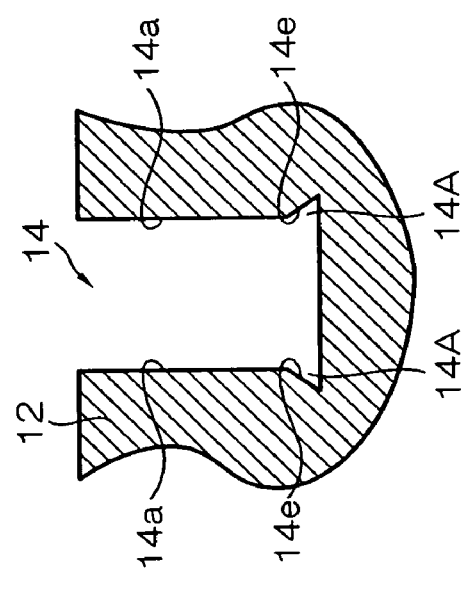
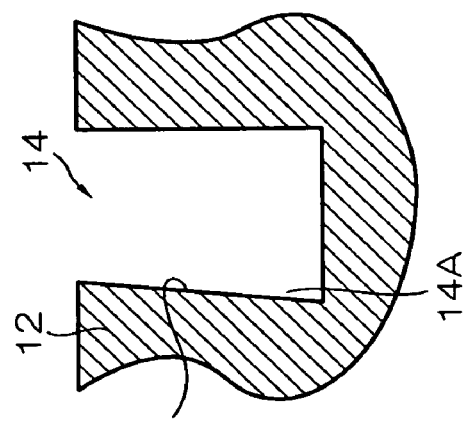
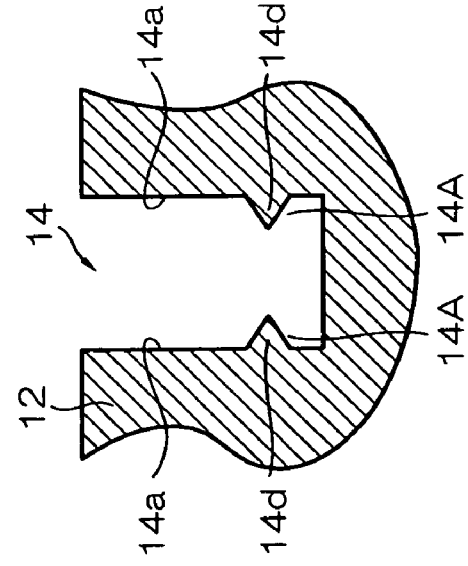
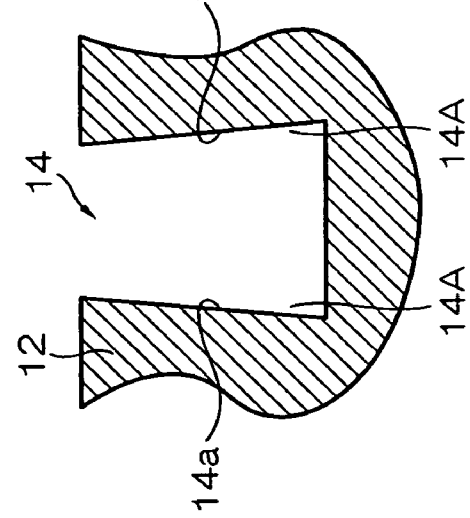

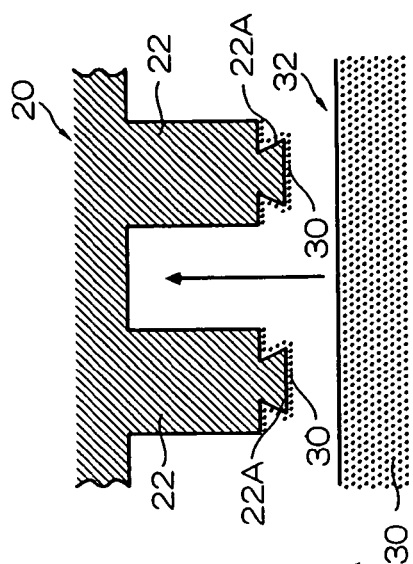
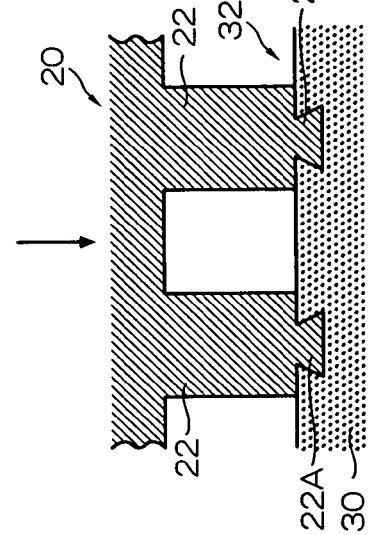
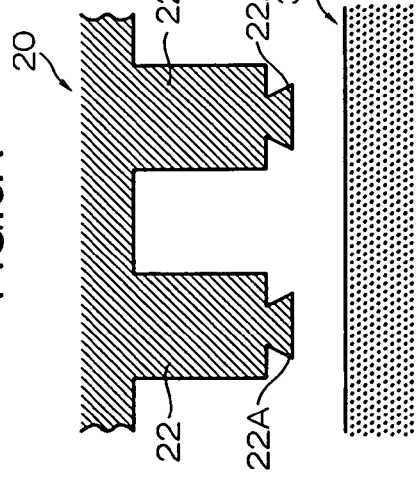
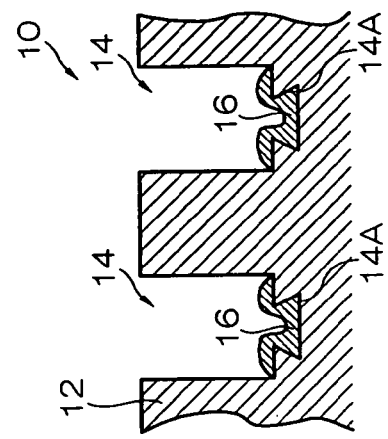
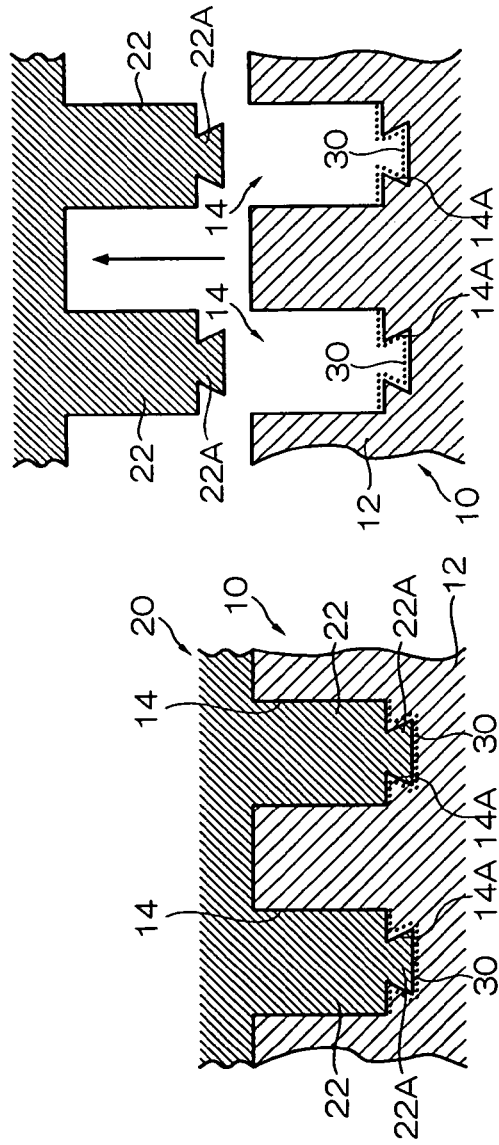
FIG.6A  FIG.6B  FIG.6C
FIG.6D  FIG.6E  FIG.6F

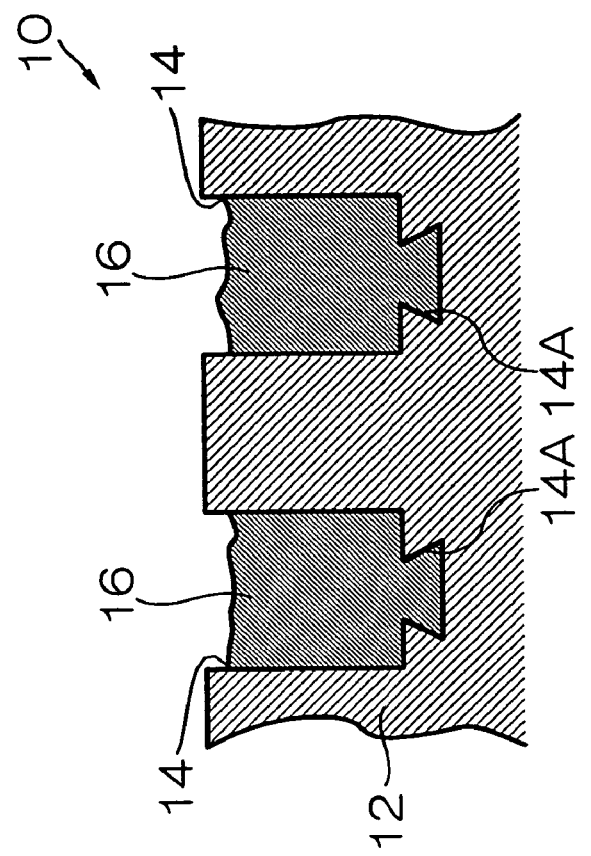
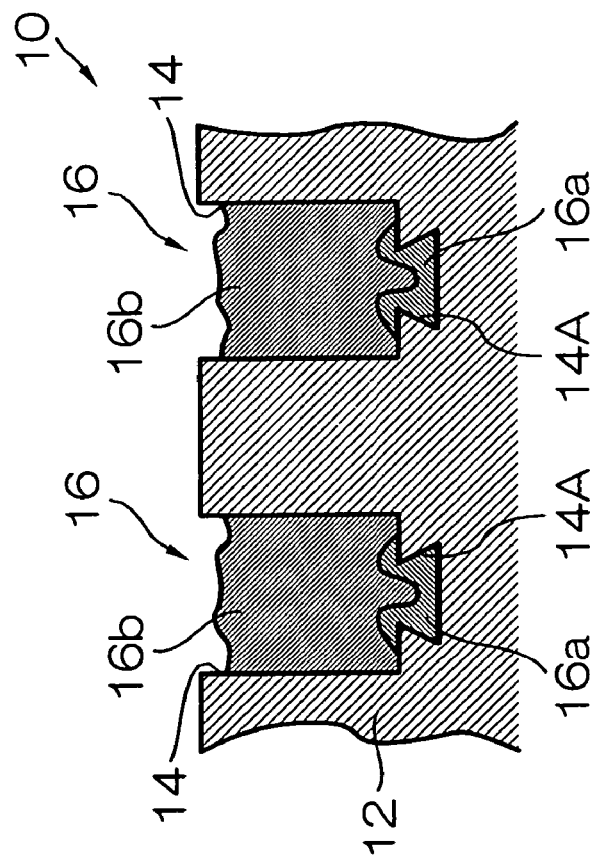

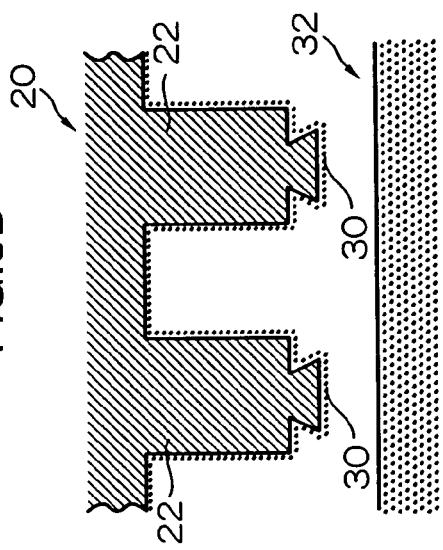
FIG.8A
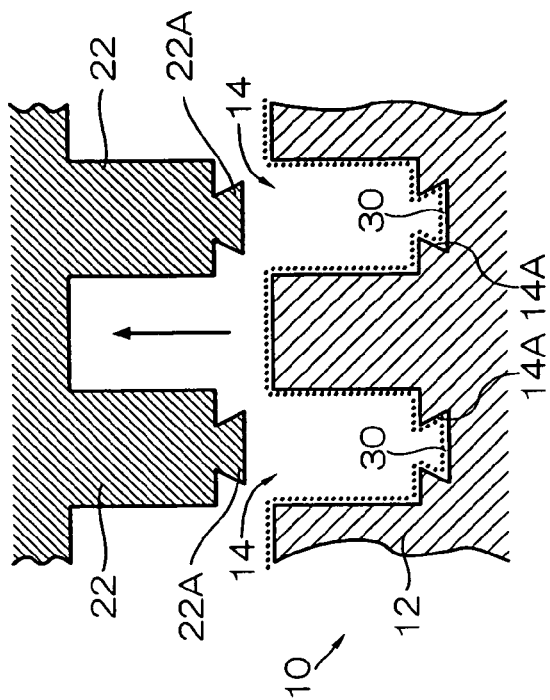
FIG.8B
FIG.8C
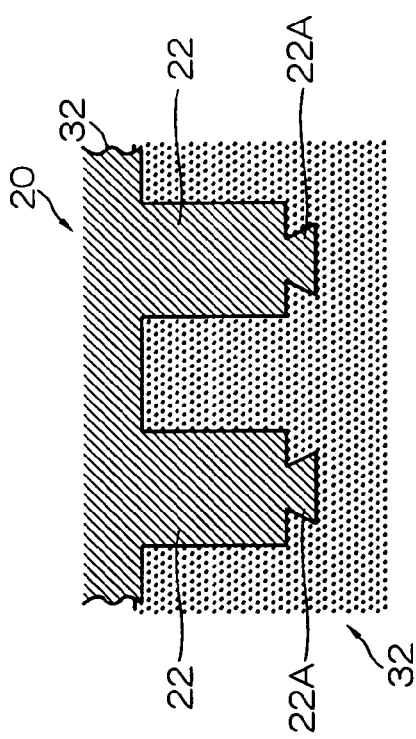
FIG.8D
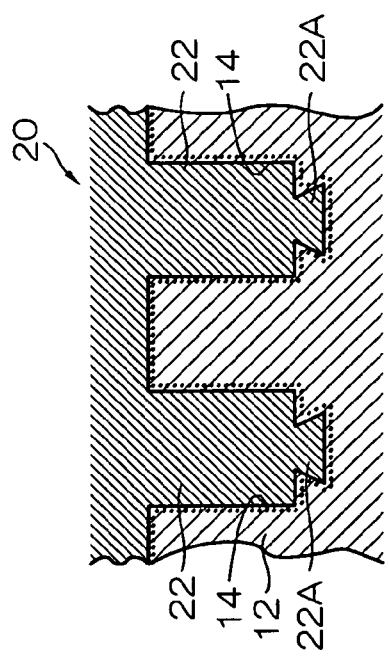

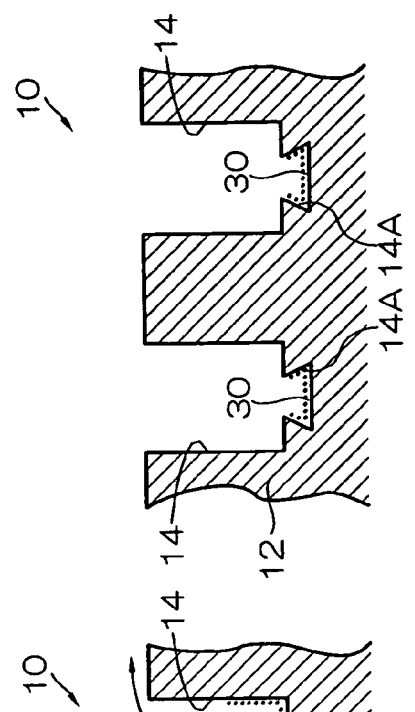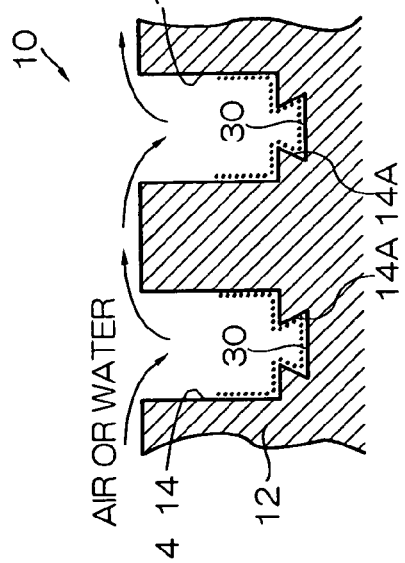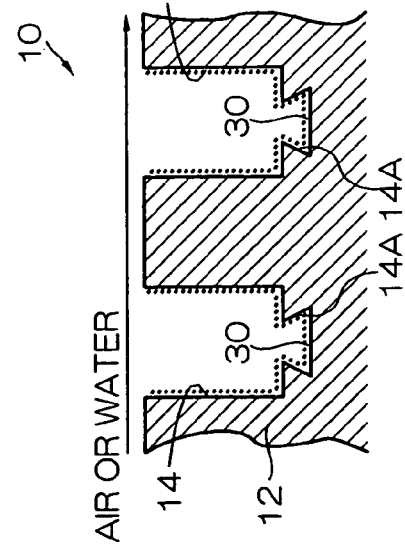

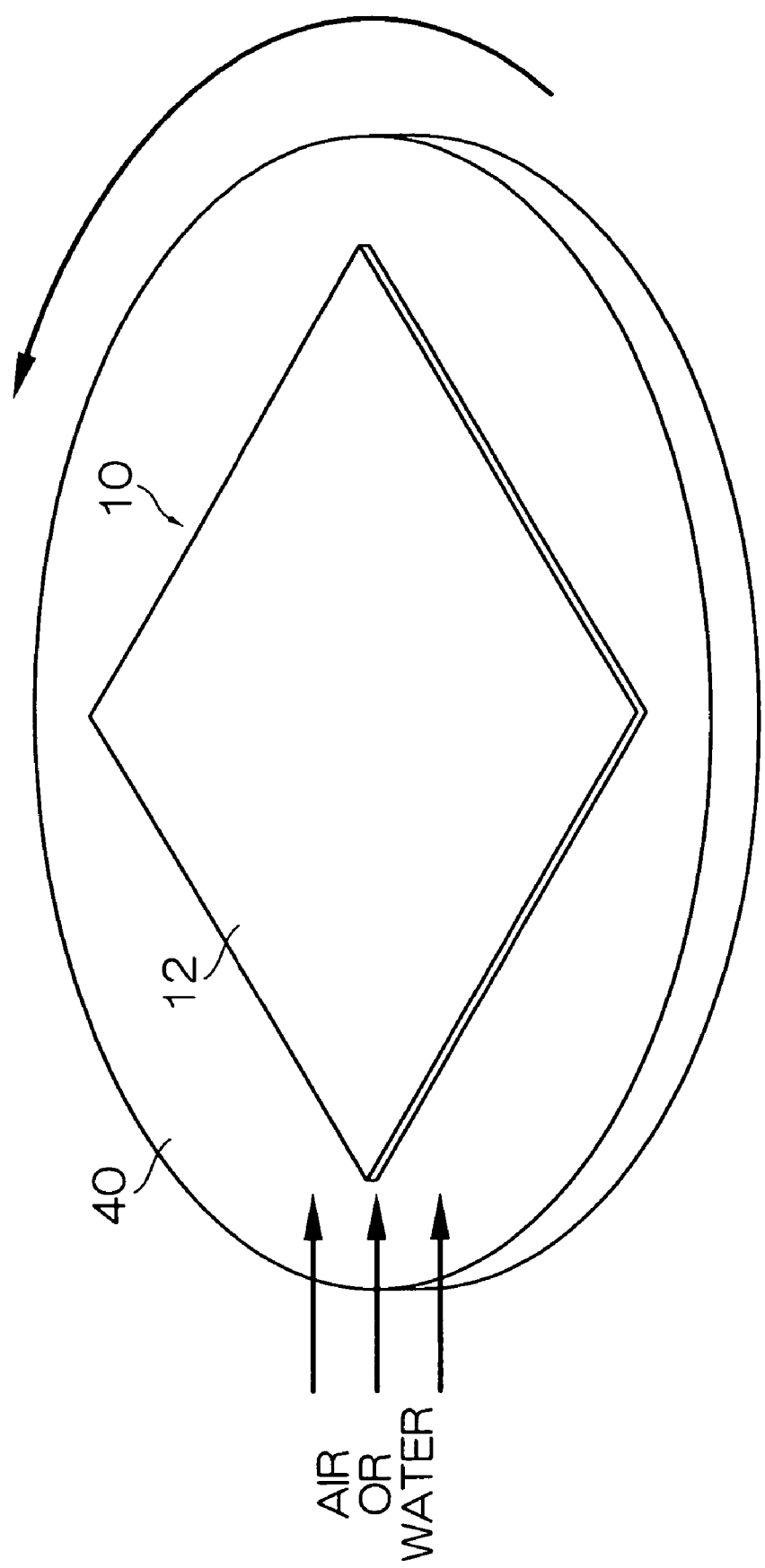

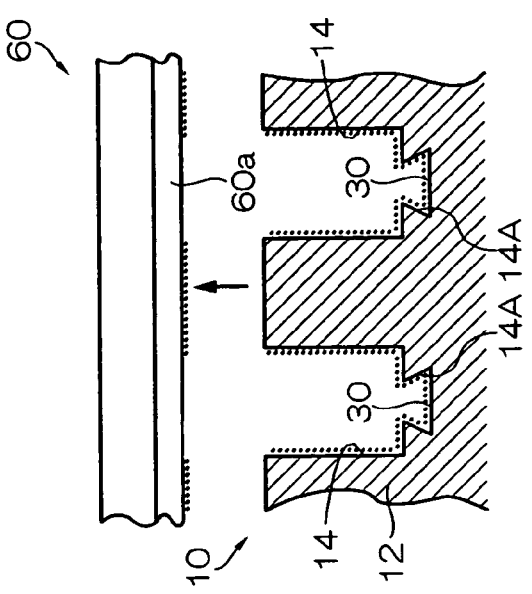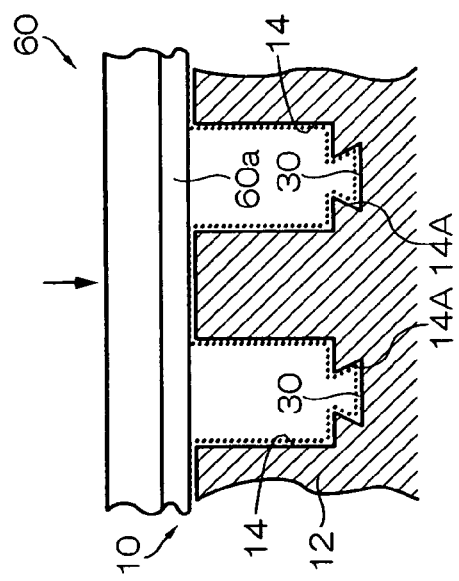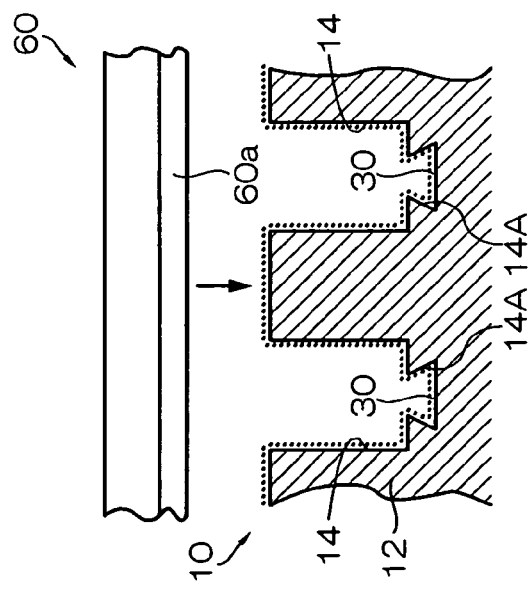

WIRING BOARD, METHOD OF MANUFACTURING WIRING BOARD, AND LIQUID EJECTION HEAD

BACKGROUND OF THE INVENTION

1. Field of the Invention

The present invention relates to a wiring board, a method of manufacturing a wiring board, and a liquid ejection head, and more particularly, to a wiring board, a method of manufacturing a wiring board, and a liquid ejection head, in which very fine electrical wires are formed at high density on a substrate.

2. Description of the Related Art

An inkjet recording apparatus is known as one apparatus for recording text characters and images onto a recording medium, such as paper. An inkjet recording apparatus forms images by means of ink dots, by causing ink to be ejected from a recording head comprising nozzles for ejecting ink, in accordance with an image signal, thereby depositing ink droplets onto a recording medium, while moving the recording medium relatively with respect to the print head. Typical known ink ejection methods are a method which ejects ink from nozzles by means of the bubbles generated in pressure chambers by heat generating elements, and a method which ejects ink from nozzles by means of the volume change of the pressure chambers caused by piezoelectric elements.

In inkjet recording apparatuses of this kind, in order to achieve high image quality on a par with silver halide photography, it is necessary to arrange the nozzles at high density in the recording head. Furthermore, in order to arrange the nozzles at high density in the recording head, it is also necessary to achieve very fine dimensions in the electrical wires connected to the heat generating elements or piezoelectric elements, or the like, and to arrange these wires at high density also. For example, if providing wires for a 2400 dpi (dots per inch) nozzle arrangement on one surface of a substrate, the width and interval of the wires must be 10 μm or less, and in practice, it must be 5 μm or less. In order to achieve further increases in nozzle density in the future, it is thought that even finer wiring, in other words, extremely fine wiring of approximately 1 μm, or less than 1 μm, will be required.

As a method of achieving fine wiring on a substrate at high densities of this kind, the use of semiconductor lithography has been considered, but this requires steps for forming and removing masks, and the like, and therefore it involves high costs.

On the other hand, when forming electrical wires on a substrate by means of a plating process, in order to achieve plating at the order of 1 μm, it is necessary to ensure sufficient bonding force with the under layer, as well as forming a resist pattern.

In order to resolve problems involved in forming very fine electrical wires by plating in this way, Japanese Patent Application Publication No. 6-302936 proposes the formation of electrical wires having high adhesiveness by patterning and roughening the surface of a glass substrate by sandblasting, and then carrying out metal plating on this roughened surface only.

Japanese Patent Application Publication No. 6-196840 proposes that when manufacturing a circuit board by resin molding, very fine undulations be formed in the circuit forming portion of the die, and catalyst seeds be deposited in these undulations before resin molding of the substrate, thereby causing the catalyst seeds to be transferred onto the substrate, whereupon a plating process achieving a high level of adhesiveness is carried out.

Japanese Patent Application, Publication No. 2003-502507 proposes carrying out electroless plating by transferring catalytic ink onto a substrate by means of a stamp corresponding to a wiring pattern, thereby forming a catalyst layer on the substrate, and then transferring resist material onto same by means of a stamp corresponding to the wiring pattern and carrying out etching, thereby forming a pattern in the catalyst layer, whereupon electroless plating is carried out.

Both of the methods described in Japanese Patent Application Publication Nos. 6-302936 and 6-196840 increase plating adhesion by forming undulations in the surface of the substrate, but since these undulations are of the order of 1 μm or above (in Japanese Patent Application Publication No. 6-302936, the depth of the undulations is 2 μm or less, and in Japanese Patent Application Publication No. 6-196840, the surface roughness Ra is 1.0 to 5.0 μm), then if seeking to form fine wires at a high density having a width and interval of 1 μm or less, the undulations in the wiring sections cannot be ignored and they can give rise to breaking of the wires, and the like.

On the other hand, the method described in Japanese Patent Application Publication No. 2003-502507 does not involve roughening of the surface of the substrate, and therefore provides stable electrical connections, but it has drawbacks in that the plating is liable to peel away from the under layer and suitable adhesiveness cannot be guaranteed.

Furthermore, in the above-described related art, the catalyst forming the base points for the plating is simply deposited on the substrate and then transferred, which means that the transfer efficiency is low and leads to the risk of peeling away of the catalyst due to mechanical and thermal stresses both during and after the plating process.

SUMMARY OF THE INVENTION

The present invention has been contrived in view of the foregoing circumstances, an object thereof being to provide a wiring board, a method of manufacturing a wiring board, and a liquid ejection head, having secure electrical connections and high reliability, in which the adhesiveness of wiring can be increased by depositing catalyst forming the base points of the plating, reliably on the substrate, in the case of very fine electrical wires having dimensions of approximately 1 μm or less.

In order to attain the aforementioned object, the present invention is directed to a wiring board having electrical wires of a prescribed pattern, comprising: a substrate on which grooves are formed in the prescribed pattern, each of the grooves having an undercut part; and a conductive material which is disposed inside the grooves so as to serve as the electrical wires.

According to this aspect of the present invention, the conductive material disposed in the grooves form a structure that is not liable to detachment due to the anchoring effect of the undercut parts. Furthermore, since a structure is adopted which ensures adhesiveness by means of the shape of the undercuts, rather than by roughening the surface, then even if very fine electrical wires of 1 μm or less are formed, there is no risk of wire breakage and therefore electrical connections of high reliability can be guaranteed.

Preferably, the conductive material is disposed inside the grooves by a plating process.

According to this aspect of the present invention, it is possible to manufacture the wiring board having very fine wires of low resistance, formed to a high density, and to achieve highly reliable electrical connections, at low cost.

In order to attain the aforementioned object, the present invention is also directed to a liquid ejection head comprising the above-described wiring board.

According to this aspect of the present invention, since the adhesiveness of the wires can be increased, then even in the case of very fine electrical wires of 1 μm or less, it is possible to achieve increased nozzle density, readily.

In order to attain the aforementioned object, the present invention is also directed to a-method of manufacturing a wiring board having electrical wires of a prescribed pattern, the method comprising the steps of: forming grooves on a substrate in the prescribed pattern, each of the grooves having an undercut part; and disposing conductive material inside the grooves so as to serve as the electrical wires.

According to this aspect of the present invention, the conductive material disposed in the grooves form a structure that is not liable to detachment due to the anchoring effect of the undercut parts. Furthermore, since a structure is adopted which ensures adhesiveness by means of the shape of the undercuts, rather than by roughening the surface, then even if very fine electrical wires of 1 μm or less are formed, there is no risk of wire breakage and therefore electrical connections of high reliability can be guaranteed.

Preferably, the conductive material is disposed inside the grooves by a plating process.

According to this aspect of the present invention, it is possible to manufacture the wiring board having very fine wires formed to a high density, and to achieve highly reliable electrical connections at low cost.

Preferably, the grooves are formed by resin molding of the substrate using a die.

According to this aspect of the present invention, it is possible to form grooves of a prescribed shape, in a simple fashion.

Preferably, the substrate is formed by the resin molding using the die having groove forming portions on which catalyst is deposited; the catalyst is transferred into the grooves in the substrate when separating the substrate from the die; and insides of the grooves are plated with the conductive material using the catalyst, thereby the conductive material being disposed inside the grooves.

According to this aspect of the present invention, the catalyst in the undercut parts always makes contact with the resin material when separated from the die, and therefore, the catalyst can be deposited easily and reliably inside the grooves of the resin material. Furthermore, since the plating process is carried out immediately after molding, there is no requirement for patterning and the manufacturing costs can be reduced.

Preferably, the substrate is separated from the die while ultrasonic vibrations are applied to the die.

According to this aspect of the present invention, even though the undercut parts are formed in the grooves, the substrate can still be removed easily from the die.

According to the wiring board and the method of manufacturing the wiring board according to the present invention, it is possible to increase the adhesiveness of electrical wires, and to form very fine electrical wires at high density, while achieving electrical connections of high reliability.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 3A to 3F are cross-sectional diagrams showing the composition of further embodiments of wiring grooves;

FIGS. 6A to 6F are illustrative diagrams showing an approximate view of a manufacturing process for the wiring board;

FIGS. 7A and 7B are illustrative diagrams of further embodiments of a plating process;

FIGS. 8A to 8D are illustrative diagrams showing an approximate view of a manufacturing process in a case where the substrate is resin molded by depositing catalyst onto the all of the regions of the die which make contact with the resin material;

FIGS. 9A to 9C are illustrative diagrams showing an approximate view of a method of removing the catalyst;

FIG. 10 is an illustrative diagram showing an approximate view of a method of removing the catalyst while rotating the substrate;

FIGS. 12A to 12C are illustrative diagrams showing an approximate view of a method of removing the catalyst using a sticky pad;

DETAILED DESCRIPTION OF THE PREFERRED EMBODIMENTS

Figure 1:
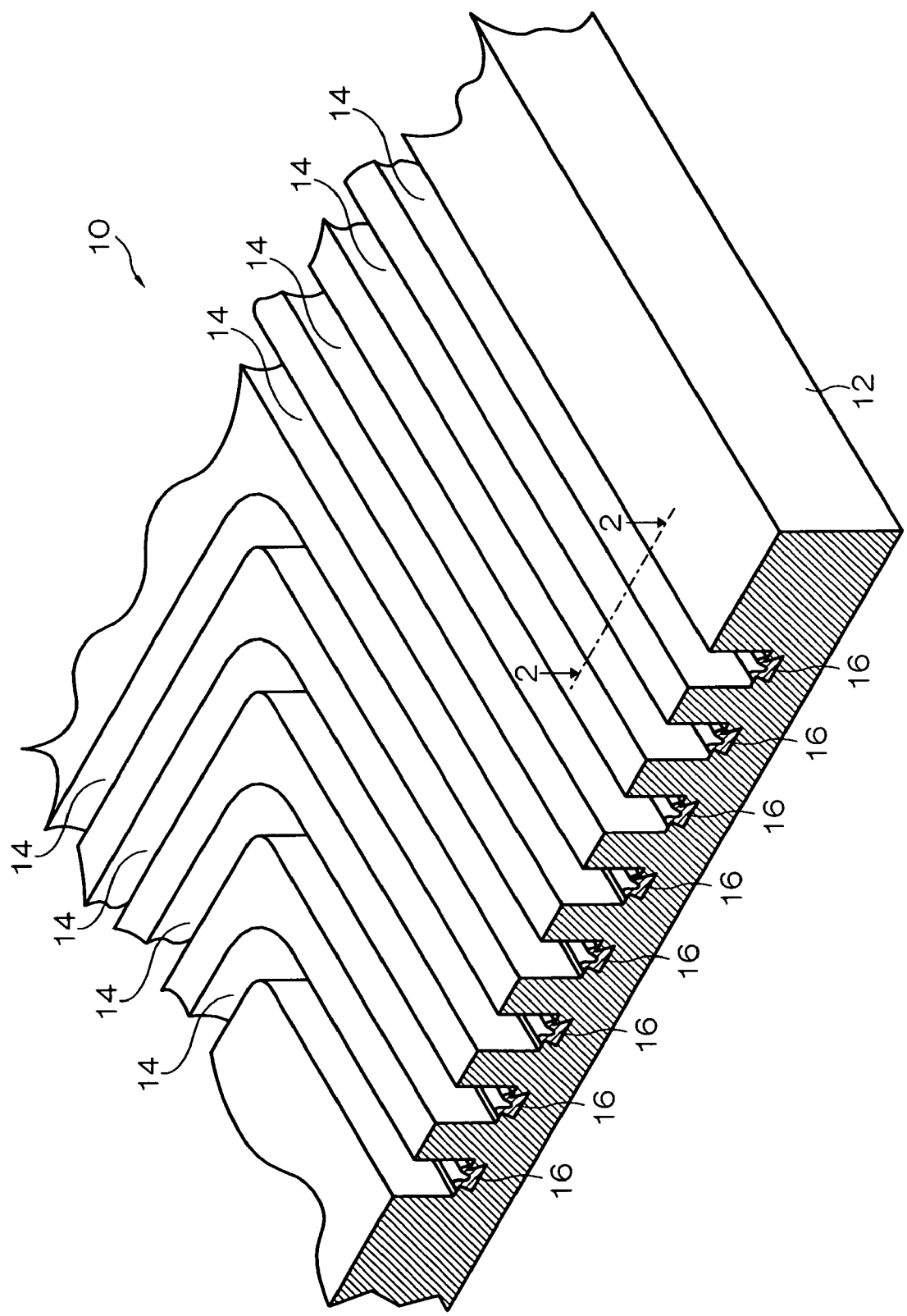
FIG. 1 is an oblique diagram showing the composition of the principal parts of a wiring board according to an embodiment of the present invention.

FIG. 1 is an oblique diagram showing the composition of the principal parts of a wiring board according to an embodiment of the present invention.

As shown in FIG. 1, the wiring board 10 according to the present embodiment has conductive material 16 disposed on the inner sides of wiring grooves 14 formed in a substrate 12, thereby forming electrical wires having a prescribed pattern.

Figure 2:
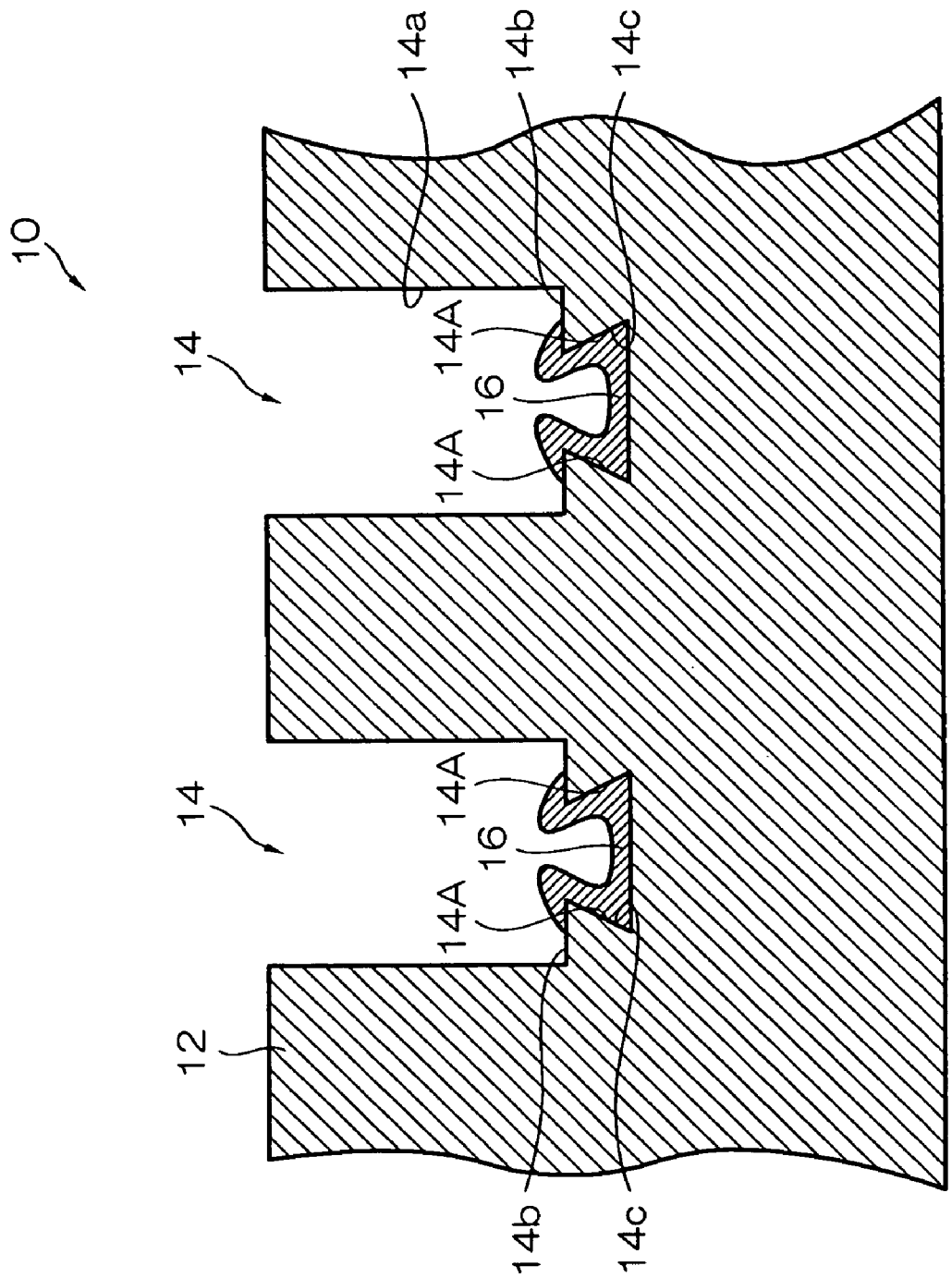
FIG. 2 is a cross-sectional diagram showing the composition of the principal parts of the wiring board.

The wiring grooves 14 in which the conductive material 16 is disposed have undercut parts 14A, as shown in FIG. 2, and the adhesiveness of the conductive material 16 disposed inside the wiring grooves 14 is increased by the anchoring effect of the undercut parts 14A.

In other words, the undercut parts 14A act as hooks, and thus have the effect of preventing peeling away or detachment of the conductive material 16.

Here, the undercut part means a recess formed or cut in the lower part in order to leave an upper edge or an overhanging portion of material, and it is formed as a part having an expanding shape inside the wiring groove 14 that increases in width from the opening side toward the side of the groove bottom.

In the embodiment shown in FIG. 2, the undercut part 14A is formed by creating a groove 14c having a trapezoid shaped cross-section, in a horizontally formed bottom face 14b of the wiring groove 14.

The undercut parts 14A formed in the wiring grooves 14 are not limited to this embodiment, and as shown in FIGS. 3A to 3F, they may adopt various other shapes.

Figure 4:
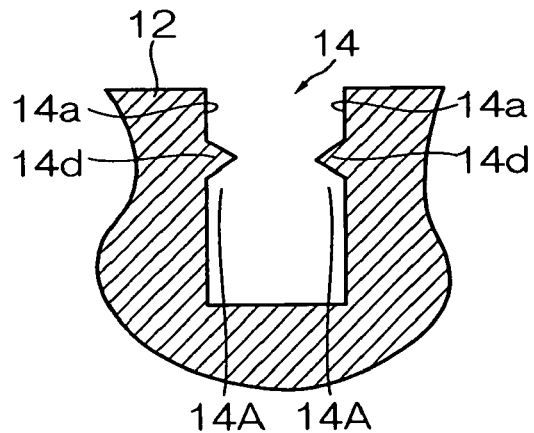
FIG. 4 is a cross-sectional diagram showing the composition of a further embodiment of wiring grooves.

FIG. 3A shows a case where the undercut part 14A is formed inside the wiring groove 14 by forming projections 14d having a triangular cross-sectional shape, on inner walls 14a of the wiring groove 14. In this case, if the undercut part 14A is formed by forming the projections 14d on the inner walls 14a of the wiring groove 14, then desirably, the projections 14d are formed in the vicinity of the upper portion of the wiring groove 14, as shown in FIG. 4. Consequently, the wiring volume at the lower side of the undercut part 14A is made large, and therefore the wiring becomes more secure and less liable to detachment.

FIG. 3B shows a case where the undercut part 14A is formed inside the wiring groove 14 by forming recesses 14e having a triangular cross-sectional .shape, on the lower end parts of the inner walls 14a of the wiring groove 14.

FIG. 3C shows a case where the undercut part 14A is formed in the wiring groove 14 by curving the lower end portion of the wiring groove 14.

FIG. 3D shows a case where the undercut part 14A is formed in the wiring groove 14 by inclining both inner walls 14a of the wiring groove 14, in such a manner that the wiring groove 14 widens from the opening side toward the bottom.

FIG. 3E shows a case where the undercut part 14A is formed in the wiring groove 14 by inclining one inner wall 14a of the wiring groove 14, in such a manner that the wiring groove 14 widens from the opening side toward the bottom.

FIG. 3F shows a case where the undercut part 14A is formed inside the wiring groove 14 by forming a projection 14f having a parallelogram-shaped cross-section, on the horizontally formed bottom face 14b of the wiring groove 14.

The undercut part 14A formed in the wiring groove 14 in this way should be formed at at least one point on the inner wall or bottom surface of the wiring groove 14, and should have a shape which is capable of generating an anchoring effect on the conductive material 16 disposed inside the wiring groove 14.

In FIGS. 3A to 4, it is necessary to dispose the wire reliably inside the undercut part, and the structures in FIGS. 3A, 3D and 4, which have a large space to the lower side of the undercut part, are more desirable in that they create a more reliable hooking effect.

Figure 5A:
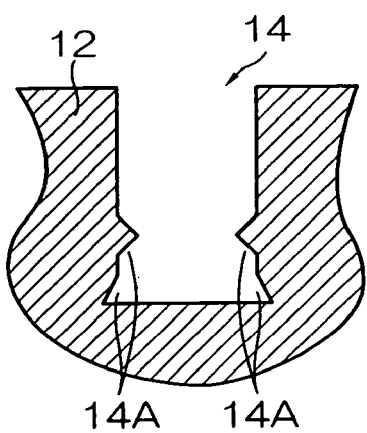
FIGS. 5A to 5D are cross-sectional diagrams showing the composition of further embodiments of wiring grooves.
Figure 5B:
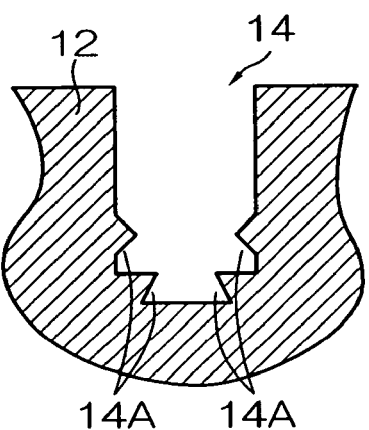
Figure 5C:
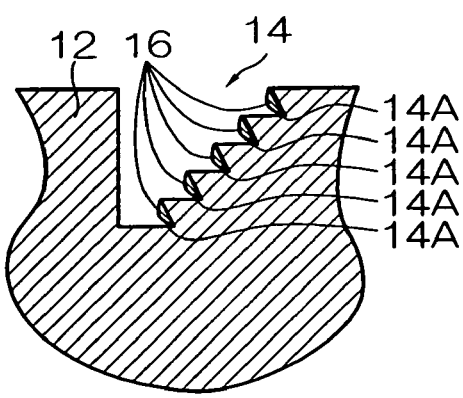

Furthermore, it is also possible to form undercut parts in a plurality of stages by combining a plurality of shapes, and it is possible, for example, to form the undercut parts 14A at an upper position and a lower position by combining the shapes of the undercut parts 14A shown in FIGS. 3A and 3B, as shown in FIG. 5A. Similarly, as shown in FIG. 5B, it is also possible to form the undercut parts 14A in an upper position and a lower position, by combining the shapes of the undercut parts 14A shown in FIGS. 2 and 3A. Furthermore, as shown in FIG. 5C, it is also possible to form the undercut parts 1 4A having a plurality of steps, by introducing cutaways having a triangular cross-section, in a stepped fashion, in one side of the inner wall of the wiring groove 14. In a case of this kind, it is also possible to dispose the conductive material 16 selectively on the inclined surfaces of the undercut parts 14A.

Figure 5D:
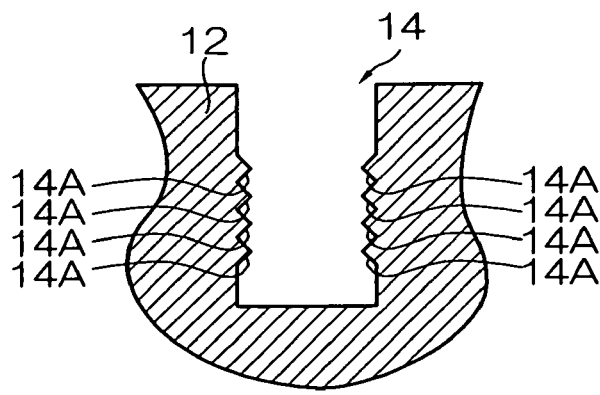

Furthermore, as shown in FIG. 5D, it is also possible to form the undercut parts 14A by repeating the shape of the undercut part 14A shown in FIG. 3A, in the vertical direction, whereby an extremely strong effect for preventing the conductive material 16 from peeling or detaching is obtained. This shape corresponds to a case where surface roughness of the die is transferred to.

The wiring groove 14 having the undercut part 14A of this kind may be formed in the substrate 12 by machine processing or the like, and more desirably, they are formed integrally with the substrate 12 by resin molding the substrate 12 in a prescribed die, as described hereinafter. Even though the substrate has undercut parts, it is still possible to separate the die from the substrate, by resin molding under certain conditions.

If the substrate 12 is formed by resin molding, then the resin constituting the substrate 12 may be a thermoplastic resin or a thermosetting resin. In the case of a thermoplastic resin, it is possible to use polycarbonate, polyethylene, polypropylene, or the like, and in the case of a thermosetting resin, it is possible to use epoxy resin, phenol resin, or the like.

Desirably, a material having low electrical resistance is used for the conductive material 16 disposed inside the wiring grooves 14, and copper (Cu), silver (Ag), gold (Au), or the like, is used.

The method of disposing the conductive material 16 inside the wiring grooves 14 is not limited in particular, but desirably, it is disposed inside the wiring grooves 14 by means of a plating process, as described hereinafter. In this case, there are no particular restrictions on the method used in the plating process. It is possible to dispose the conductive material 16 inside the wiring grooves 14 by means of electroplating or electroless plating, or the like. Furthermore, it is also possible to carry out electroless plating followed by electroplating.

Moreover, as shown in FIG. 1, the wiring pattern formed on the substrate 12 may be curved, and it is formed to a desired shape in accordance with the intended use.

There is no particular restriction on the width of the wiring grooves 14, but in the wiring board 10 according to the present embodiment, since the adhesiveness of the conductive material 16 is raised by the anchoring effect created by the undercut parts 14A formed in the wiring grooves 14, without roughening the surface, then even in the case of very fine wires of 0.1 μm to 2 μm, it is possible to achieve stable electrical connections without the occurrence of wire breakages. Furthermore, there is no particular restriction on the aspect ratio of the wiring grooves 14, but in general, an aspect ratio of 10 to 5 or less is practical.

Next, a method of manufacturing the wiring board according to the present embodiment having the composition described above is explained.

In the wiring board 10 according to the present embodiment, the wiring grooves 14 are formed integrally with the substrate 12 by resin molding the substrate 12 by means of a prescribed die, and electrical wires of a prescribed pattern are formed by plating the conductive material 16 into the wiring grooves 14 formed by the resin molding step.

FIGS. 6A to 6F are illustrative diagrams showing an approximate view of a manufacturing process for the wiring board 10 according to the present embodiment.

As described above, in the present embodiment, the substrate 12 is made by resin molding using a die, and therefore, firstly, a prescribed die 20 is prepared, as shown in FIG. 6A. In the present embodiment, the substrate 12 and the wiring grooves 14 are formed integrally by resin molding, and therefore the die 20 is prepared to have wiring groove forming portions 22, and undercut part forming portions 22A are formed in these wiring groove forming portions 22. There are no particular restrictions on the method of manufacturing the die 20, and it may be formed by machine processing a carbide material, or it may be manufactured by a combination of electrical discharge processing and electroforming.

The substrate 12 is resin molded using the die 20 described above. In the present embodiment, a catalyst used in the plating process is deposited inside the wiring grooves 14 during resin molding. In other words, by resin molding in a state where catalyst is deposited on the wiring groove forming portions 22, the catalyst is transferred into the wiring grooves 14 of the molded substrate 12.

In the present embodiment, the wiring groove forming portions 22 of the die 20 are dipped in a catalyst 30 in a catalyst vessel 32, whereby the catalyst 30 is made to adhere to the wiring groove forming portions 22 of the die 20.

In the present embodiment, the catalyst 30 is deposited only on the undercut part forming portions 22A of the wiring groove forming portions 22, and as shown in FIG. 6B, the height of the die 20 is controlled with respect to the catalyst vessel 32, in such a manner that only the undercut part forming portions 22A are dipped in the catalyst 30 in the catalyst vessel 32.

By dipping only the undercut part forming portions 22A in the catalyst 30 in this way, and then raising the die 20 again, the catalyst 30 is made to adhere to the undercut part forming portions 22A of the wiring groove forming portions 22, as shown in FIG. 6C.

Here, the catalyst is a colloid including metal powder (solid) or metal ions, and the metal powder is most desirable, since it does not require post-processing. Consequently, in the present embodiment, it is supposed that the metal powder is used as the catalyst 30. The size of the metal powder needs to be smaller than the width of the wiring grooves 14, and when forming very fine wires, it must have a diameter equal to or less than 1 μm.

Moreover, since the metal powder often oxidizes and the plating process cannot progress in this situation, then in order to activate the powder, it is desirable to remove the oxide film by carrying out plasma processing or ultraviolet processing, in an oxygen-free state (for example, in a nitrogen atmosphere or in a vacuum).

Furthermore, in order to make the catalyst adhere effectively to the die 20, desirably, the catalyst 30 is deposited after applying a release agent to the die 20, and this also improves the separation between the die 20 and the resin material.

The substrate 12 is resin molded as shown in FIG. 6D using the die 20 in which the catalyst 30 is deposited in the wiring groove forming portions 22, as described above, and after molding, the die 20 is separated, as shown in FIG. 6E.

In this case, since the die 20 has the undercut part forming portions 22A, the die 20 must be separated while the substrate 12 is in a deformable state. Therefore, the temperature of the die 20 during separation must be equal to or above the glass transition temperature (Tg) of the resin material forming the substrate 12, and in order to prevent fluid movement of the resin material, desirably, the temperature is above the glass transition temperature by not more than 20° C. Moreover, in order to be able to readily separate the resin material, desirably, ultrasonic vibrations are applied to the die 20 during the separation process. Therefore, the die 20 can be separated without causing damage to the undercut parts 14A.

By resin molding the substrate 12 as described above, the wiring grooves 14 having the undercut parts 14A are formed integrally with the substrate 12. Moreover, the catalyst 30 deposited on the undercut part forming portions 22A of the die 20 is transferred to the undercut parts 14A of the wiring grooves 14 thus formed.

Subsequently, as shown in FIG. 6F, electroless plating is carried out, using the catalyst 30 transferred to the undercut parts 14A of the wiring grooves 14 as seeds, and the conductive material 16 is thereby disposed inside the wiring grooves 14.

The conductive material 16 is used for the electrical wires, and desirably, it has low electrical resistance. Materials such as copper (Cu), silver (Ag) or gold (Au) can be used.

Here, if the electroless plating is carried out using gold (Au) as the conductive material 16, then it is possible to use sodium hypophosphite, formaldehyde, or sodium borohydride, as a reducing agent, and if sodium hypophosphite is used, for example, then the metal powder deposited on the die 20 can be gold (Au), nickel (Ni), palladium (Pd) or cobalt (Co).

On the other hand, if the electroless plating is carried out using copper (Cu) as the conductive material 16, then it is possible to use formaldehyde as the reducing agent, and it is possible to use copper (Cu), gold (Au), silver (Ag), platinum (Pt), or palladium (Pd) as the metal powder deposited on the die 20.

After performing the electroless plating, electroplating may also be carried out, thereby enhancing the adhesiveness yet further. In other words, by carrying out electroplating after performing the electroless plating, the undercut parts 14 also become covered with plating, and hence peeling away or detachment of the plating is prevented and adhesiveness is further enhanced. Moreover, in general, electroplating has an advantage in that it allows the resistance to be set lower than with electroless plating, and the plating growth is also more rapid. Therefore, it also has an advantage in that the cross-sectional area of the wiring can be increased and the wiring resistance can be reduced.

In this case, as shown in FIG. 7A, it is also possible to form an electroless plating 16a, followed by forming an electroplating 16b, in such a manner that the conductive material 16 fills the wiring grooves 14.

If the conductive material 16 fills the wiring grooves 14, then as shown in FIG. 7B, the plating is grown by the electroless plating only, in such a manner that the conductive material 16 fills the wiring grooves 14. Growing the plating by the electroless plating alone has a merit in that it does not require equipment for the electroplating, and hence equipment costs can be restricted. However, if the plating is grown by performing the electroless plating followed by the electroplating, as described above, then the plating growth speed is high, contamination is low, and electrical resistance is low. Therefore, growing the plating by the electroless plating followed by the electroplating is desirable.

In cases where the conductive material 16 fills the wiring grooves 14, then if the plating is grown until the wiring grooves 14 are buried completely, there is a risk that wiring leaks may occur. Therefore, it is desirable to grow the plating to an intermediate point (i.e., not to the brim) of the wiring grooves 14.

As described above, according to the method of manufacturing the wiring board according to the present embodiment, since the wiring grooves 14 are resin molded together with the substrate 12, the number of processing steps can be reduced compared to a case where the wiring grooves 14 are formed by machine processing, or the like, and therefore, manufacturing costs can be reduced.

Furthermore, by depositing the catalyst 30 on the die 20 and transferring the catalyst 30 to the substrate 12 at the same time as the molding, it becomes possible to reduce the number of processing steps in comparison with a case where the catalyst 30 is deposited separately inside the wiring grooves 14, and therefore manufacturing costs can be reduced. Moreover, since the plating processing is carried out immediately after the molding, manufacturing costs can also be reduced in this respect. Furthermore, since the catalyst 30 can be deposited reliably onto the undercut parts 14A as well, then it is possible to carry out the plating on the undercut parts 14A, in a reliable fashion.

In the embodiment described above, when depositing the catalyst 30 onto the die 20, the catalyst 30 is deposited only onto the undercut part forming portions 22A of the die 20, but the regions where the catalyst 30 is deposited are not limited to these. For example, it is also possible to deposit the catalyst on the whole of the wiring groove forming portions 22, and it is also possible to deposit the catalyst 30 on all of the regions of the die 20 which make contact with the resin material.

FIGS. 8A to 8D are illustrative diagrams showing an approximate view of a manufacturing process in a case where the substrate is resin molded by depositing the catalyst onto the all of the regions of the die which make contact with the resin material.

Firstly, the catalyst 30 is deposited onto all of the regions of the die 20 to be made contact with the resin material. Here, similarly to the above-described embodiment, metal powder is used as the catalyst 30, and as shown in FIG. 8A, the die 20 is dipped in the catalyst 30 in the catalyst vessel 32, while controlling the height of the die 20 with respect to the catalyst vessel 32, thereby causing the catalyst 30 to adhere to the regions of the die 20 that will make contact with the resin material.

When only the regions of the die 20 which make contact with the resin material have been dipped in the catalyst 30 in this way and the die 20 is then raised up, the catalyst 30 is adhering to all of the regions of the die 20 that make contact with the resin material, as shown in FIG. 8B.

Subsequently, the substrate 12 is resin molded, as shown in FIG. 8C, using the die 20 to which the catalyst 30 is adhering. When the die 20 is separated from the substrate 12 formed by the resin molding in this way, the catalyst 30 is transferred to all of the surfaces of the substrate 12, including the wiring grooves 14, as shown in FIG. 8D.

Similarly to the above-described embodiment, the temperature during separation is equal to or above the glass transition temperature (Tg) of the resin material forming the substrate 12, and desirably, above the glass transition temperature by not more than 20° C., and ultrasonic vibrations are applied to the die 20 during separation. Thereby, even in the case of the substrate 12 having the undercut parts 14A, the die 20 can be separated easily.

In this case, since the catalyst 30 is applied to all of the surfaces of the substrate 12 as described above, then it is necessary to remove the catalyst 30 from the parts except those where it is required for carrying out the plating in the wiring grooves 14.

Here, since the catalyst 30 is simply adhering to the resin, it can be removed by means of an air blower, water jet, or the like.

If the catalyst 30 is removed by using the air blower or water jet, or the like, then as shown in FIGS. 9A to 9C, it is possible to adjust the manner in which the catalyst 30 is left on the resin, by means of the blowing action of the air or water jet. In other words, for example, if air or water is blown perpendicularly to the direction in which the wiring grooves 14 are formed, as shown in FIG. 9A, then the catalyst 30 can readily be left inside the wiring grooves 14, and if it is blown at an angle with respect to the direction in which the wiring grooves 14 are formed, as shown in FIG. 9B, then it is possible to leave the catalyst 30 in the periphery of the bottom portions of the wiring grooves 14, only. Here, even if the catalyst 30 is separated by using the air blower or water jet in this fashion, it is possible to leave the catalyst 30 in the undercut parts 14A, at the least, as shown in FIG. 9C.

Moreover, if air or water is blown from one direction, then the catalyst 30 is removed more readily from the wiring grooves 14 where the direction of wiring coincides with the blowing direction of the air or water, and therefore it is also possible to turn the substrate 12 while blowing the air or water. For example, as shown in FIG. 10, the substrate 12 is mounted on a turntable 40 and air or water is blown while turning the substrate 12, thereby removing the catalyst. In this way, it is possible to prevent detachment of the catalyst in particular grooves.

In cases where the catalyst 30 is removed by using the air blower or water jet, or the like, then even if the catalyst 30 is left in parts other than those where it is required, provided that the catalyst density is low, the plating does not join up continuously when the plating process is carried out, and therefore, it establishes no wires in these parts and hence no problems arise.

Figure 11A:
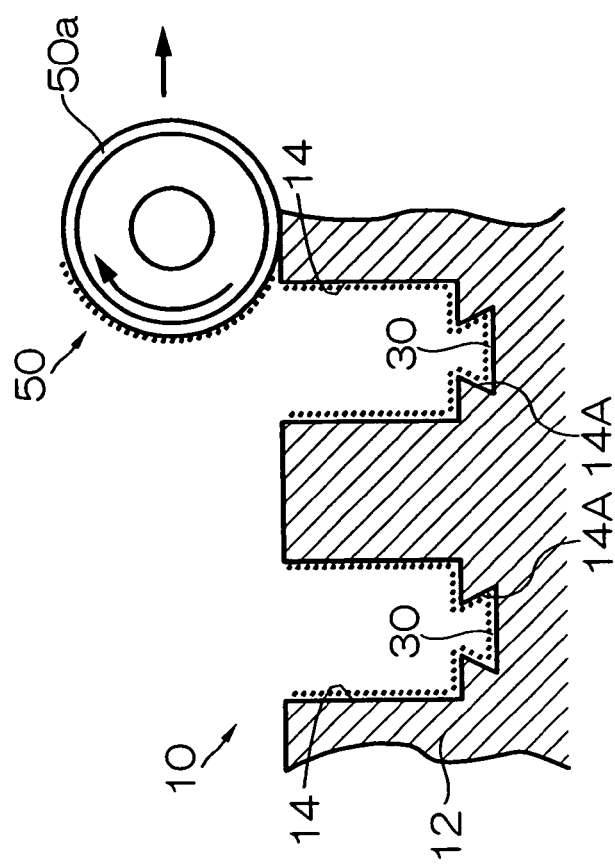
FIGS. 11A and 11B are illustrative diagrams showing an approximate view of a method of removing the catalyst using a sticky roller.
Figure 11B:
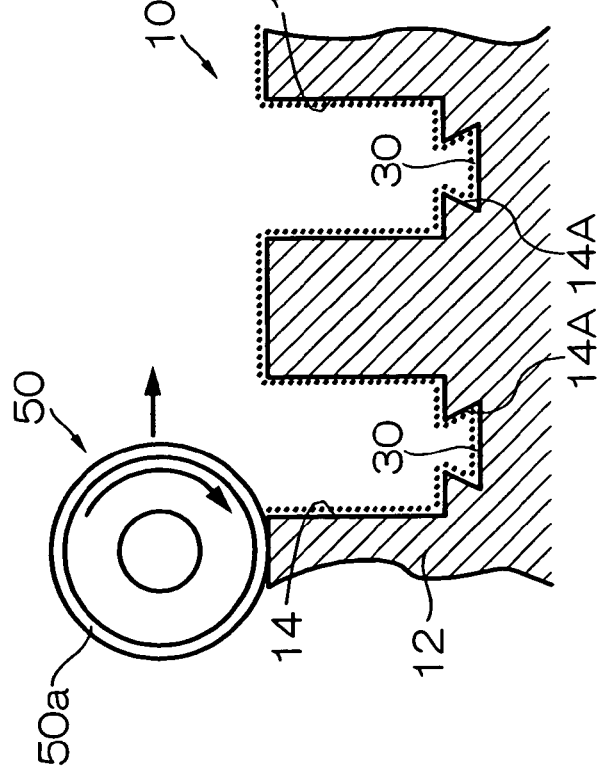

Apart from this, other methods can be used for removing the catalyst 30 from the regions where it is not required, such as a method for removing the catalyst 30 by rolling a roller (sticky roller) 50 having a sticking layer 50a on the surface thereof, over the substrate 12, as shown in FIGS. 11A and 11B, or a method where the catalyst 30 is removed by pressing a pad (sticky pad) 60 having a sticking layer 60a on the surface thereof, against the substrate 12, as shown in FIGS. 12A to 12C, for example. In this way, it is possible to remove the topmost layer of the catalyst 30 reliably, by rolling the sticky roller 50 over the substrate 12 or pressing the sticky pad 60 against the substrate 12.

It is also possible to remove the catalyst 30 from the parts where it is not required, by using a combination of the method based on the sticky roller 50 or sticky pad 60, and the method based on the air blower or water jet. In other words, after removing the catalyst 30 by means of the air blower or water jet, the sticky roller 50 is rolled over the substrate 12, or the sticky pad 60 is pressed against the substrate 12, and the catalyst 30 is thereby removed from the parts where it is not required.

Moreover, when using metal powder as the catalyst 30, the metal often becomes oxidized, and therefore, similarly to the embodiment described above, it is desirable to remove the oxide film by performing plasma processing or UV processing, in an oxygen-free state.

As described above, the substrate 12 formed by resin molding then receives electroless plating of the conductive material 16, using the catalyst 30 deposited in the wiring grooves 14 as seeds. Similarly, to the embodiment described above, desirably, the conductive material 16 has low electrical resistance, and materials such as copper (Cu), silver (Ag) or gold (Au) can be used.

Figure 13A:
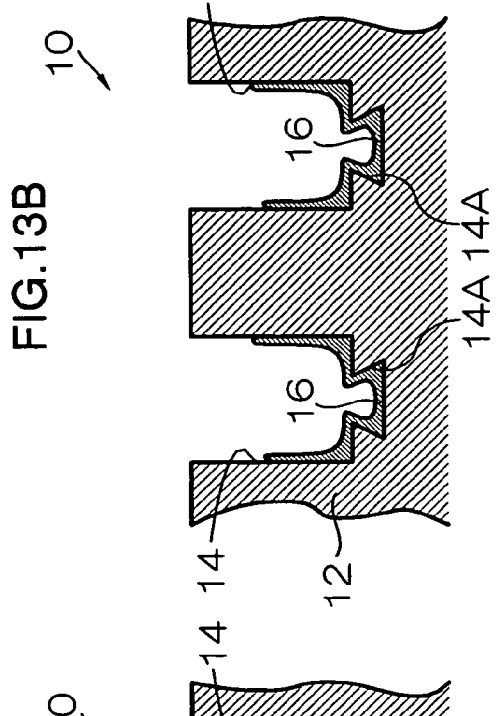
FIGS. 13A to 13D are illustrative diagrams showing an approximate view of a plating process.
Figure 13B:
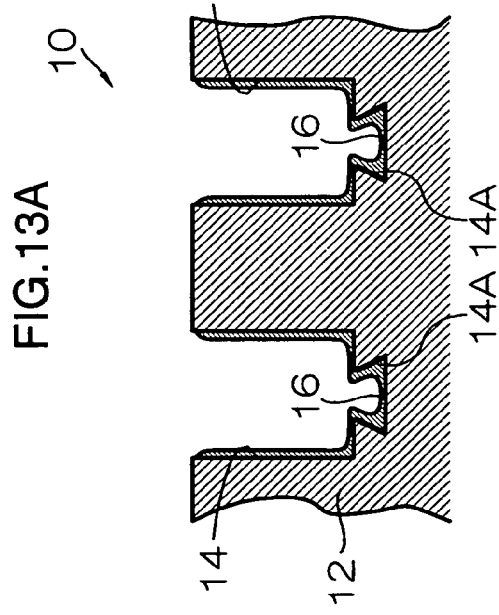
Figure 13C:
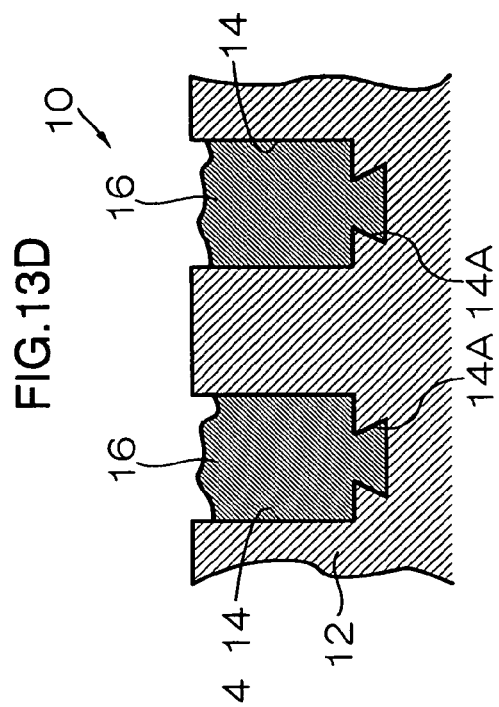

The conductive material 16 can be plated in accordance with the deposition state of the catalyst 30, as shown in FIGS. 13A to 13D. For example, if the catalyst 30 is deposited onto all of the inner surfaces of the wiring grooves 14 (corresponding to the case shown in FIG. 9A), then the conductive material 16 is plated onto all of the inner surfaces of the wiring grooves 14, as shown in FIG. 13A. If the catalyst 30 is deposited onto the periphery of the bottom portions of the wiring grooves 14 (corresponding to the case shown in FIG. 9B), then the conductive material 16 is plated onto the periphery of the bottom portions of the wiring grooves 14, as shown in FIG. 13B. If the catalyst 30 is deposited only onto the undercut parts 14A of the wiring grooves 14 (corresponding to the case shown in FIG. 9C), then the conductive material 16 is plated onto the undercut parts 14 of the wiring grooves 14, as shown in FIG. 13C.

In any of these cases, since the plating is carried out at least in the undercut parts 14A, it is possible to dispose the conductive material 16 inside the wiring grooves 1 4 while achieving a high level of adhesiveness.

Figure 13D:
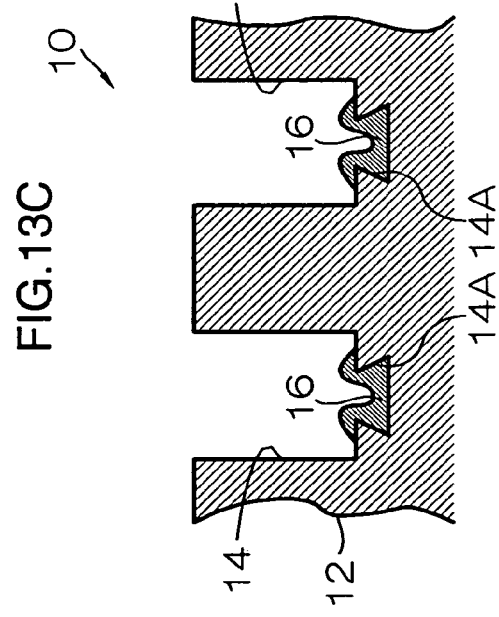

It is also possible to grow the plating, in such a manner that the conductive material 16 fills the wiring grooves 14, as shown in FIG. 13D. In this case, it is possible to grow the plating by electroless plating only, or to grow the plating by performing electroless plating, followed by electroplating. Growing the plating by the electroless plating alone has a merit in that it does not require equipment for electroplating, and hence equipment costs can be restricted. However, if the plating is grown by performing the electroless plating followed by the electroplating, as described above, then the plating growth speed is high, contamination is low, and electrical resistance is low. Therefore, growing the plating by the electroless plating followed by the electroplating is desirable.

In cases where the conductive material 16 fills the wiring grooves 14, then if the plating is grown until the wiring grooves 14 are buried completely, there is-a risk that wiring leaks may occur. Therefore, it is desirable to grow the plating to an intermediate point (i.e., not to the brim) of the wiring grooves 14.

Even if the catalyst 30 is deposited on all of the parts of the die 20 which make contact with the resin material, as described above, it is possible to deposit the catalyst 30 reliably on the undercut parts 14A, and therefore, the conductive material 16 can be disposed inside the wiring grooves 14 with a high level of adhesiveness.

In the embodiment described above, the catalyst 30 is deposited onto the required parts of the die 20 by dipping the die 20 in the catalyst 30 in the catalyst vessel 32, but the method of depositing the catalyst 30 is not limited to this. For example, it is possible to deposit the catalyst 30 on the required parts of the die 20 by means of stamping or spray application.

Since the wiring board having the composition according to the embodiments described above can be formed with the wires of high density and very fine dimensions, it can be used in a wide variety of fields. Here, one practical example is described in relation to a case where the wiring board according to the present invention is used in the wiring of a piezoelectric element cover of a piezoelectric-type inkjet head.

Figure 14:
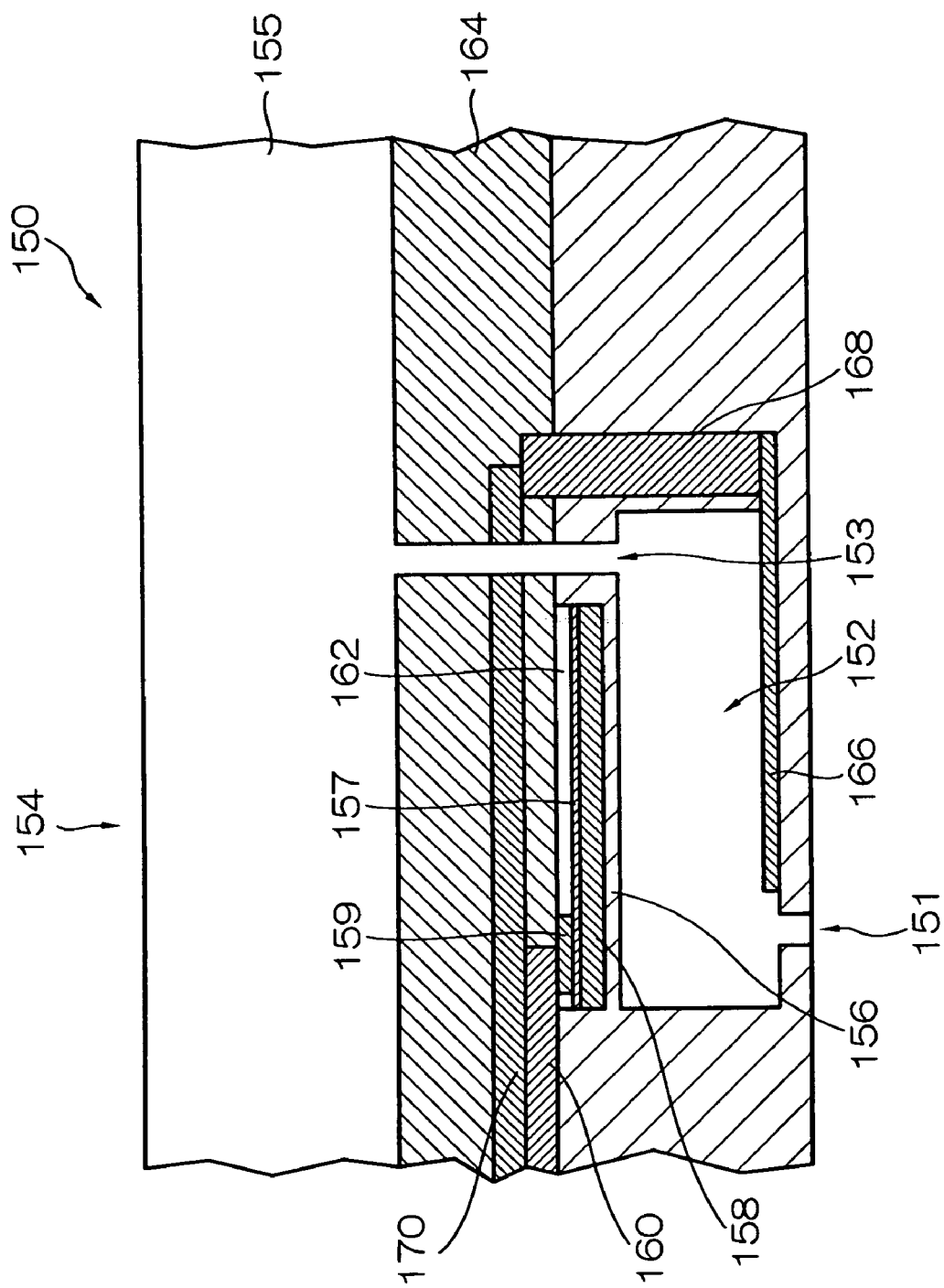
FIG. 14 is a cross-sectional diagram of an ink ejection unit in a piezoelectric-type inkjet head.

A piezoelectric-type inkjet head has an arrangement of ink ejection units for ejecting ink, in a two-dimensional matrix configuration, and it forms an image on a recording medium by ejecting ink individually from the ink ejection units. FIG. 14 is a cross-sectional diagram of an ink ejection unit in a piezoelectric-type inkjet head of this kind.

As shown in FIG. 14, each of the ink ejection units 154 of the piezoelectric-type inkjet head 150 comprises a pressure chamber 152, which is filled with the ink, and a nozzle 151 connected to the pressure chamber 152.

The ceiling of the pressure chamber 152 opposing the nozzle 151 is constituted by a diaphragm 156. A piezoelectric element 158 which causes the diaphragm 156 to deform is provided on the diaphragm 156, and an individual electrode 157 is provided on the upper face of the piezoelectric element 158. Furthermore, a piezoelectric element drive wire 160 for supplying a drive signal to the individual electrode 157 is connected electrically to the individual electrode 157 through a drive electrode 159.

A piezoelectric element cover 164 for protecting the piezoelectric element 158 is provided above the piezoelectric element 158, and a common liquid chamber 155 is provided above the piezoelectric element cover 164. The pressure chamber 152 is connected to the common liquid chamber 155 through an ink supply port 153, and the ink is supplied from the common liquid chamber 155. A space 162 is formed above the piezoelectric element 158, in such a manner that the piezoelectric element 158 can deform freely.

Furthermore, a pressure measurement sensor 166 for measuring the pressure of the ink inside the pressure chamber 152 is provided on the base surface of the pressure chamber 152. A sensor electrode 168 for outputting the measurement signal of the pressure measurement sensor 166 is connected to the pressure measurement sensor 166. The sensor electrode 168 is formed in a substantially vertical column shape, and it is connected to a sensor wire 170 at the upper end thereof. The sensor wire 170 and the piezoelectric element drive wire 160 are formed on the piezoelectric element cover 164.

Figure 15:
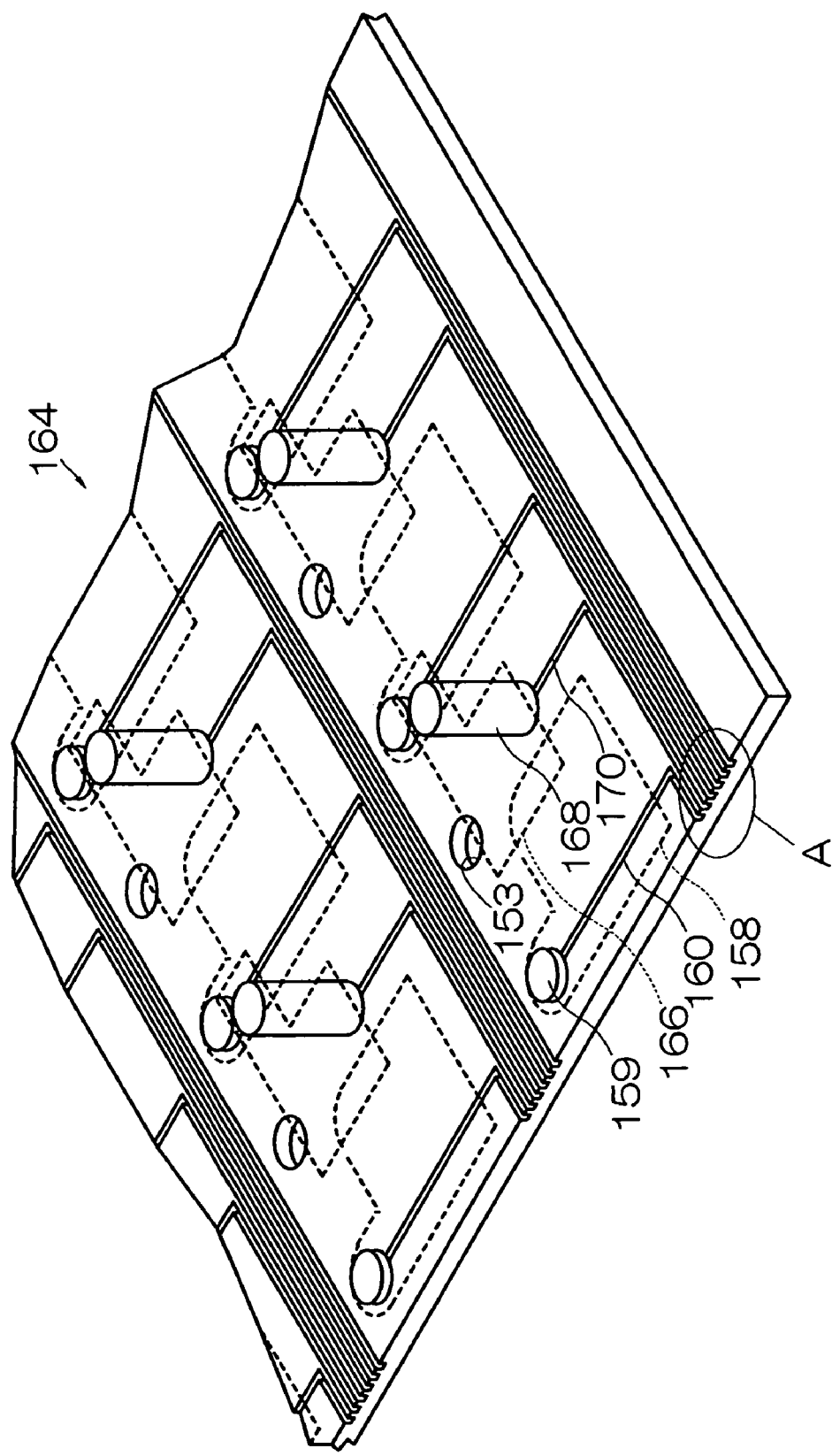
FIG. 15 is an oblique diagram of a piezoelectric element cover as viewed from a pressure chamber side.

FIG. 15 is an oblique diagram showing the piezoelectric element cover 164 as viewed from the side of the pressure chambers 152. In FIG. 15, in order to make the connections of the wires formed in the piezoelectric element cover 164 easier to understand, in addition to the piezoelectric element cover 164, the diagram also depicts the drive electrodes 159 connected to the individual electrodes 157, and the sensor electrodes 168 connected to the pressure measurement sensors 166. The positional relationships between the drive electrodes 159, the piezoelectric elements 158 corresponding to the sensor electrodes 168, and the pressure measurement sensors 166 are indicated respectively by the dotted lines in FIG. 15. Moreover, the supply ports 153 formed in the piezoelectric element cover 164 are also depicted.

FIG. 15 shows a view of the piezoelectric element cover 164 from the side of the pressure chambers 152, and therefore the piezoelectric element drive wires 160 connected to the drive wires 159, and the sensor wires 17 connected to the sensor electrodes 168, are connected to the lower sides of the drive electrodes 159 and the sensor electrodes 168 shown in FIG. 15.

The piezoelectric element drive wires 160 and the sensor wires 170 extend to the outer sides of the regions corresponding to the pressure chambers 152, and are then gathered together between the columns of pressure chambers 152 in the two-dimensional arrangement and wired following the column of pressure chambers 152.

Figure 16:
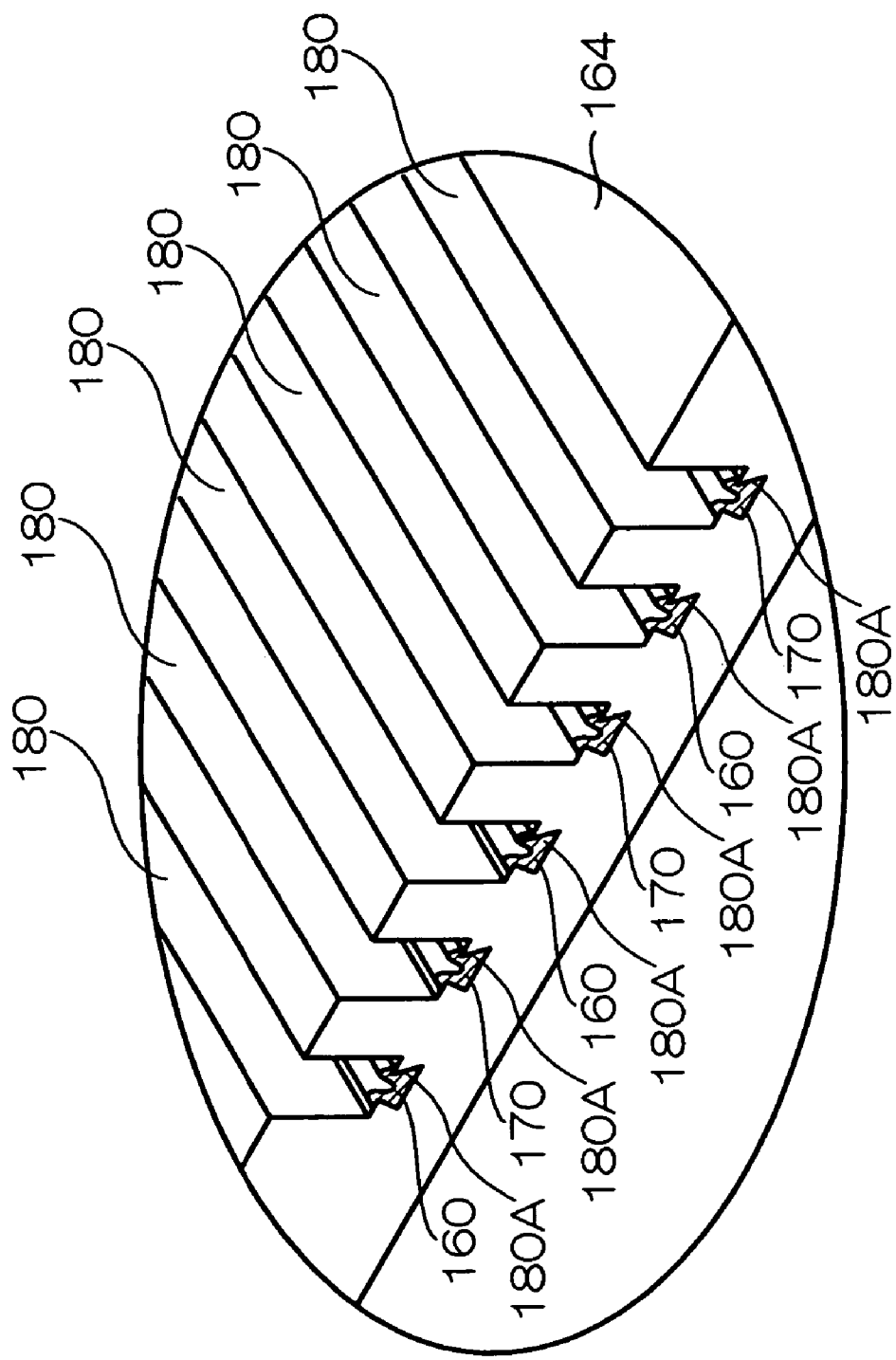
FIG. 16 is an enlarged view of section A in FIG. 15.

In order to clarify the shape of the wires, in FIG. 16, the portion of the circle A in FIG. 15 is depicted in an enlarged fashion.

As shown in FIG. 16, the piezoelectric element drive wires 160 and the sensor wires 170 are formed alternately in the wiring grooves 180 formed in the surface of the piezoelectric element cover 164.

Here, undercut parts 180A are formed in the wiring grooves 180 in which the piezoelectric element drive wires 160 and the sensor wires 170 are formed, and conductive material 182 is plated on the undercut parts 180A, thereby forming the piezoelectric element drive wires 160 and the sensor wires 170. Accordingly, even if the wires are formed at high density and to very fine dimensions, it is possible to form the piezoelectric element drive wires 160 and the sensor wires 170 having a high level of adhesiveness, and therefore stable electrical connections can be guaranteed.

Moreover, since high-density wiring can be achieved in this fashion, it is possible to miniaturize the apparatus (inkjet head).

Furthermore, by using the manufacturing steps described above, the manufacture of the apparatus becomes simpler, and cost reductions can also be achieved.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wiring board having electrical wires of a prescribed pattern, comprising:
   a substrate on which wiring grooves are formed in the prescribed pattern, each of the wiring grooves having interiorly an undercut part increasing in width from an opening side toward a groove bottom side; and
   a conductive material which is disposed inside the wiring grooves so as to serve as the electrical wires.

2. The wiring board as defined in claim 1, wherein the conductive material is disposed inside the wiring grooves by a plating process.

3. A liquid ejection head comprising the wiring board as defined in claim 1.

4. The wiring board as claimed in claim 1, wherein the undercut part is formed by creating a groove having a trapezoid shaped cross-section, in a bottom face of each of the wiring grooves.

5. The wiring board as defined in claim 1, wherein the undercut part is formed by forming a projection having a triangular cross-sectional shape, on an inner wall of each of the wiring grooves.

6. The wiring board as defined in claim 5, wherein the projection is formed in a vicinity of an upper portion of each of the wiring grooves.

7. The wiring board as defined in claim 1, wherein the undercut part is formed by forming a recess having a triangular cross-sectional shape, on a lower end part of an inner wall of each of the wiring grooves.

8. The wiring board as defined in claim 1, wherein the undercut part is formed in a plurality of stages inside each of the wiring grooves.

9. The wiring board as defined in claim 1, wherein the undercut part is formed in a plurality of stages inside each of the wiring grooves by repeating a projection having a triangular cross-sectional shape, in a vertical direction, on an inner wall of each of the wiring grooves.

10. A method of manufacturing a wiring board having electrical wires of a prescribed pattern, the method comprising the steps of: forming wiring grooves on a substrate in the prescribed pattern, each of the wiring grooves having interiorly an undercut part increasing in width from an opening side toward a groove bottom side; and disposing conductive material inside the wiring grooves so as to serve as the electrical wires.

11. The method as defined in claim 10, wherein the conductive material is disposed inside the wiring grooves by a plating process.

12. The method as defined in claim 10, wherein the wiring grooves are formed by resin molding of the substrate using a die.

13. The method as defined in claim 12, wherein: the substrate is formed by the resin molding using the die having wiring groove forming portions on which catalyst is deposited; the catalyst is transferred into the wiring grooves in the substrate when separating the substrate from the die; and insides of the wiring grooves are plated with the conductive material using the catalyst, thereby the conductive material being disposed inside the wiring grooves.

14. The method as defined in claim 12, wherein the substrate is separated from the die while ultrasonic vibrations are applied to the die.

* * * * *